(12) United States Patent
Misaki

(10) Patent No.: US 11,251,221 B2
(45) Date of Patent: Feb. 15, 2022

(54) IMAGING PANEL AND METHOD FOR MANUFACTURING SAME

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Osaka (JP)

(*) Notice: Subject to any disclaimer, the term of this patent is extended or adjusted under 35 U.S.C. 154(b) by 384 days.

(21) Appl. No.: 16/560,624

(22) Filed: Sep. 4, 2019

(65) Prior Publication Data

US 2021/0066385 A1 Mar. 4, 2021

Related U.S. Application Data

(60) Provisional application No. 62/727,831, filed on Sep. 6, 2018.

(51) Int. Cl.
| | |
|---|---|
| *H01L 27/146* | (2006.01) |
| *H01L 31/0224* | (2006.01) |
| *H01L 31/20* | (2006.01) |
| *H01L 31/105* | (2006.01) |

(52) U.S. Cl.
CPC ......... *H01L 27/14676* (2013.01); *H01L 31/022408* (2013.01); *H01L 31/1055* (2013.01); *H01L 31/202* (2013.01)

(58) Field of Classification Search
CPC ....... H01L 27/14676; H01L 31/022408; H01L 31/1055; H01L 31/202; H01L 27/14612; H01L 27/14636; H01L 27/14663; Y02E 10/50
See application file for complete search history.

(56) References Cited

U.S. PATENT DOCUMENTS

| | | |
|---|---|---|
| 5,998,806 A | 12/1999 | Stiebig et al. |
| 2007/0113886 A1 | 5/2007 | Arao et al. |
| 2014/0103347 A1 | 4/2014 | Ishino |
| 2017/0162616 A1* | 6/2017 | Tashiro ............ H01L 27/14623 |

FOREIGN PATENT DOCUMENTS

| | | |
|---|---|---|
| JP | 2000-508121 A | 6/2000 |
| JP | 2007-165865 A | 6/2007 |
| JP | 2011-159781 A | 8/2011 |
| JP | 2014-078651 A | 5/2014 |
| JP | 2015-119113 A | 6/2015 |

\* cited by examiner

*Primary Examiner* — Kiho Kim
(74) *Attorney, Agent, or Firm* — ScienBiziP, P.C.

(57) ABSTRACT

An imaging panel includes a photoelectric conversion element disposed on a substrate. The photoelectric conversion element includes a cathode electrode, a first semiconductor layer having a first conductive type, the first semiconductor layer being in contact with the cathode electrode, a second semiconductor layer having a second conductive type different from the first conductive type, the second semiconductor layer being joined to the first semiconductor layer, and an anode electrode in contact with the second semiconductor layer. The second semiconductor layer has a greater extinction coefficient as closer to the anode electrode.

7 Claims, 23 Drawing Sheets

IMAGING PANEL AND METHOD FOR MANUFACTURING SAME

CROSS-REFERENCE TO RELATED APPLICATIONS

This application claims the benefit of priority to U.S. Provisional Application No. 62/727,831 filed on Sep. 6, 2018. The entire contents of the above-identified application are hereby incorporated by reference.

BACKGROUND

Technical Field

The disclosure disclosed below relates to an imaging panel and a manufacturing method thereof.

An X-ray imaging device that captures an X-ray image with an imaging panel including a plurality of pixel parts has been known. In such an X-ray imaging device, for example, p-intrinsic-n (PIN) photodiodes are used as photoelectric conversion elements, and the PIN photodiodes convert emitted X-rays into electrical charges. The converted electrical charges are read by operating Thin Film Transistors (hereinafter, also referred to as "TFTs") included in the pixel parts, and an X-ray image is obtained on the basis of the read electrical charges. JP 2014-078651 A discloses such a photoelectric conversion element array unit.

Incidentally, in a case of a semiconductor layer in contact with an anode electrode of a photoelectric conversion element, quantum efficiency is improved in a case that the semiconductor layer has a small extinction coefficient in an optical sense. However, the semiconductor layer has a smaller dopant concentration as the extinction coefficient is smaller, and a leakage current of the photoelectric conversion element is likely to flow at a boundary surface with the anode electrode.

SUMMARY

An imaging panel, which has been made in view of the above-mentioned object, includes a substrate and a photoelectric conversion element disposed on the substrate. The photoelectric conversion element includes a cathode electrode, a first semiconductor layer having a first conductive type, the first semiconductor layer being in contact with the cathode electrode, a second semiconductor layer having a second conductive type different from the first conductive type, the second semiconductor layer being joined to the first semiconductor layer, and an anode electrode in contact with the second semiconductor layer. The second semiconductor layer has a greater extinction coefficient as closer to the anode electrode.

With the above-mentioned configuration, quantum efficiency can be improved while suppressing a leakage current of the photoelectric conversion element.

BRIEF DESCRIPTION OF DRAWINGS

The disclosure will be described with reference to the accompanying drawings, wherein like numbers reference like elements.

DESCRIPTION OF EMBODIMENTS

Figure 1:
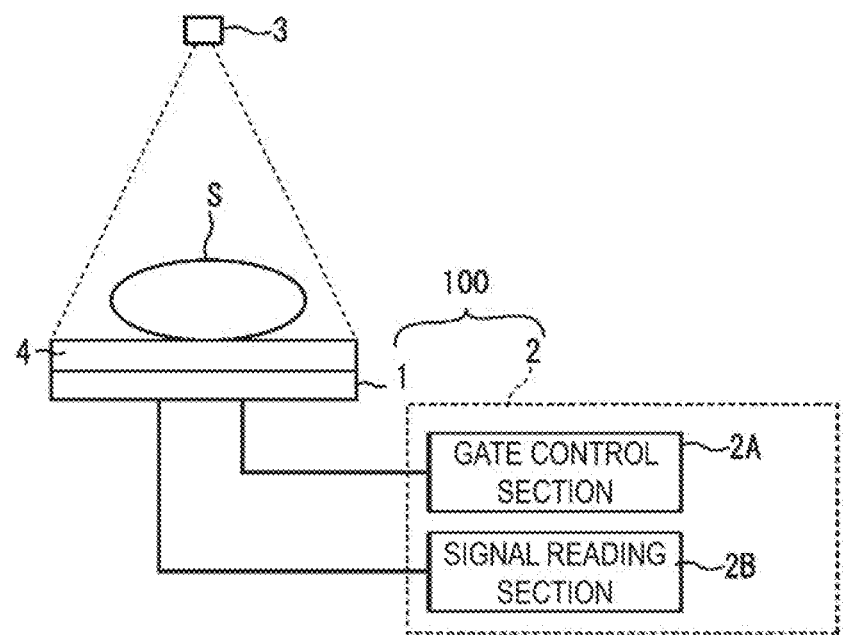
FIG. 1 is a schematic diagram illustrating an X-ray imaging device according to an embodiment.

Now, with reference to the drawings, a detailed description is made on an embodiment of the disclosure. In the drawings, the same or corresponding parts are denoted with the same reference symbols, and the description therefor is not repeated.

Configuration

FIG. 1 is a schematic diagram illustrating an X-ray imaging device according to the present embodiment. An X-ray imaging device 100 includes an imaging panel 1 and a controller 2. The controller 2 includes a gate control section 2A and a signal reading section 2B. X-rays are emitted onto an object. S from a X-ray source 3, and the X-rays passing through the object S are converted to fluorescence (hereinafter, scintillation light) at a scintillator 1A disposed on an upper part of the imaging panel 1. The X-ray imaging device 100 capture the scintillation light with the imaging panel 1 and the controller 2 so as to obtain an X-ray image.

Figure 2:
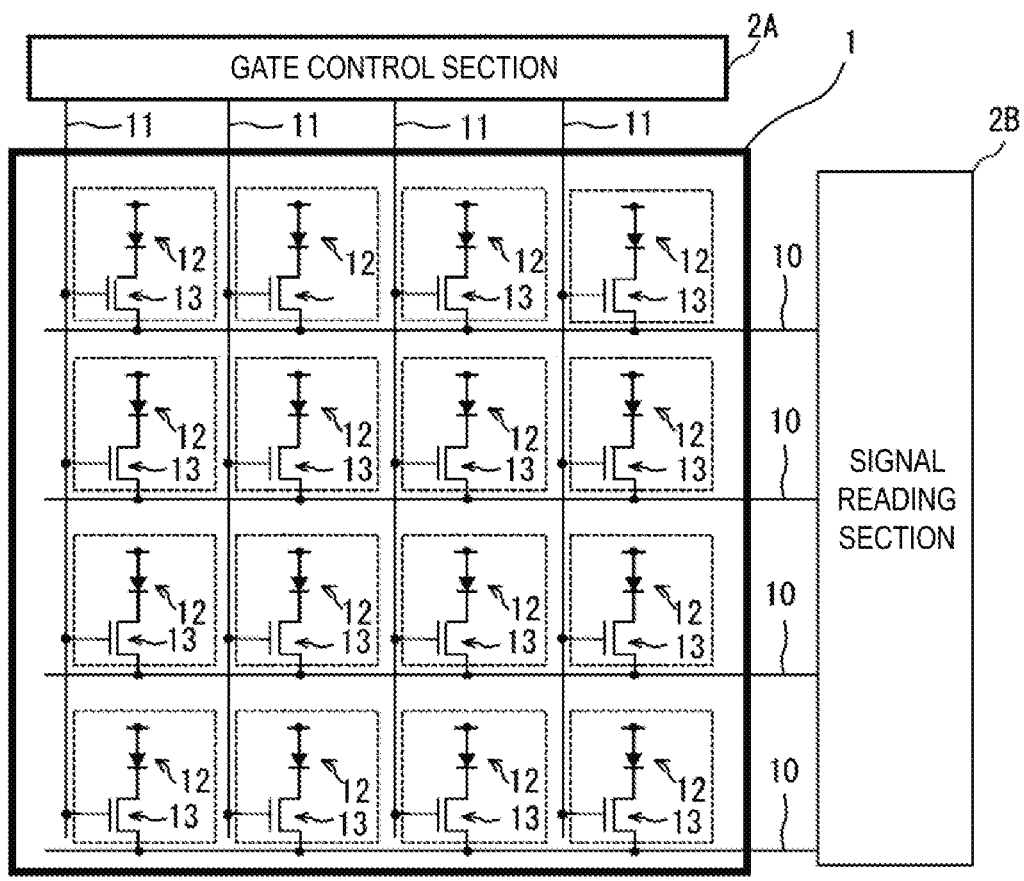
FIG. 2 is a schematic diagram illustrating a schematic configuration of an imaging panel illustrated in FIG. 1.

FIG. 2 is a schematic diagram illustrating a schematic configuration of the imaging panel 1. As illustrated in FIG. 2, a plurality of source wiring lines 10 and a plurality of gate wiring lines 11 intersecting the plurality of source wiring lines 10 are formed on the imaging panel 1. The gate wiring lines 11 are connected to the gate control section 2A, and the source wiring lines 10 are connected to the signal reading section 2B.

The imaging panel 1 has TFTs 13 connected to the source wiring lines 10 and the gate wiring lines 11 at positions at which the source wiring lines 10 and the gate wiring lines 11 intersect each other. Further, in regions surrounded by the source wiring lines 10 and the gate wiring lines 11 (hereinafter, referred to as pixels), photodiodes 12 are provided. In the pixels, the scintillation light obtained by converting the X-rays passing through the object S is converted, at the photodiodes 12, to electrical charges in accordance with amounts of the light.

Each of the gate wiring lines 11 on the imaging panel 1 is sequentially switched to a select state in the gate control section 2A, and the TFT 13 connected to the gate wiring line 11 in the select state is in an on state. In a case that the TFT 13 is in the on state, a signal in accordance with an electrical charge, the signal being converted by the photodiode 12, is output to the signal reading section 2B via the source wiring line 10.

Figure 3:
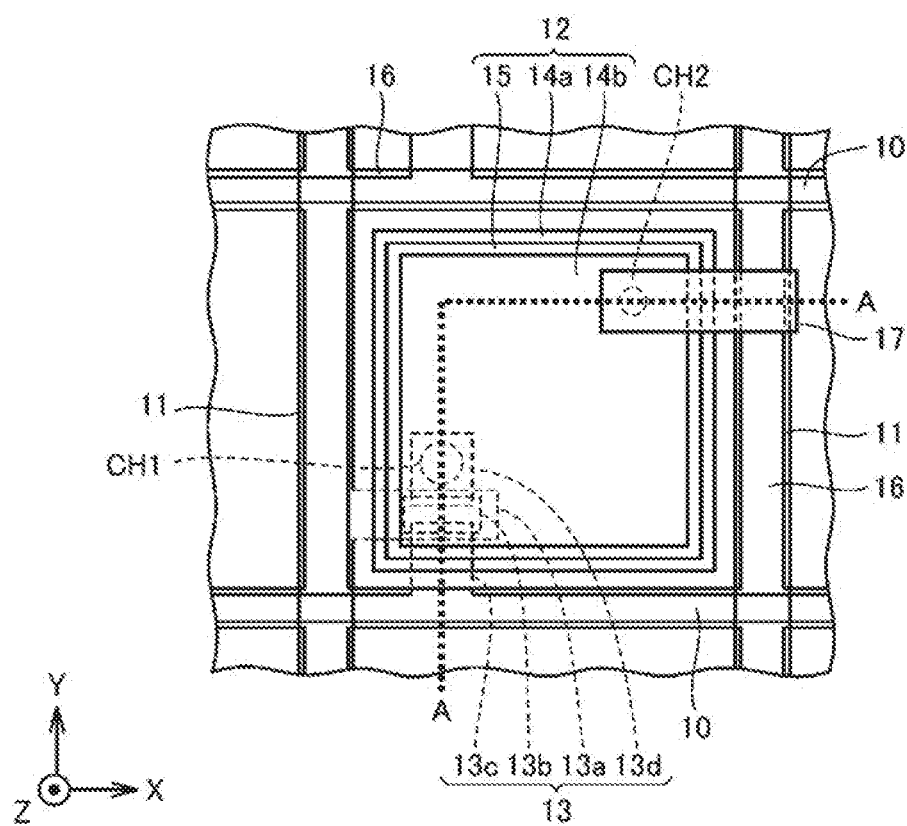
FIG. 3 is an enlarged plan view of one pixel part of the imaging panel illustrated in FIG. 2.

FIG. 3 is an enlarged plan view of one pixel part of the imaging panel 1 illustrated in FIG. 2. As illustrated in FIG. 3, the photodiode 12 and the TFT 13 are provided in the pixel surrounded by the gate wiring lines 11 and the source wiring lines 10. The photodiode 12 includes a lower electrode (cathode) 14a and an upper electrode (anode) 14b as a pair of electrodes and a photoelectric conversion layer 15. The upper electrode 14b is provided on the photoelectric conversion layer 15, that is, on a side irradiated with the X-ray emitted from the X-ray source 3 (see FIG. 1). The TFT 13 includes a gate electrode 13a integrated with the gate wiring line 11, a semiconductor active layer 13b, a source electrode 13c integrated with the source wiring line 10, and a drain electrode 13d. Further, bias wiring lines 16 are arranged so as to overlap with the gate wiring lines 11 and the source wiring lines 10 in a plan view. The bias wiring lines 16 are configured to supply a bias voltage to the photodiodes 12. In the pixel, a contact hole CH1 that connects the drain electrode 13d and the lower electrode 14a to each other is provided.

Figure 4A:
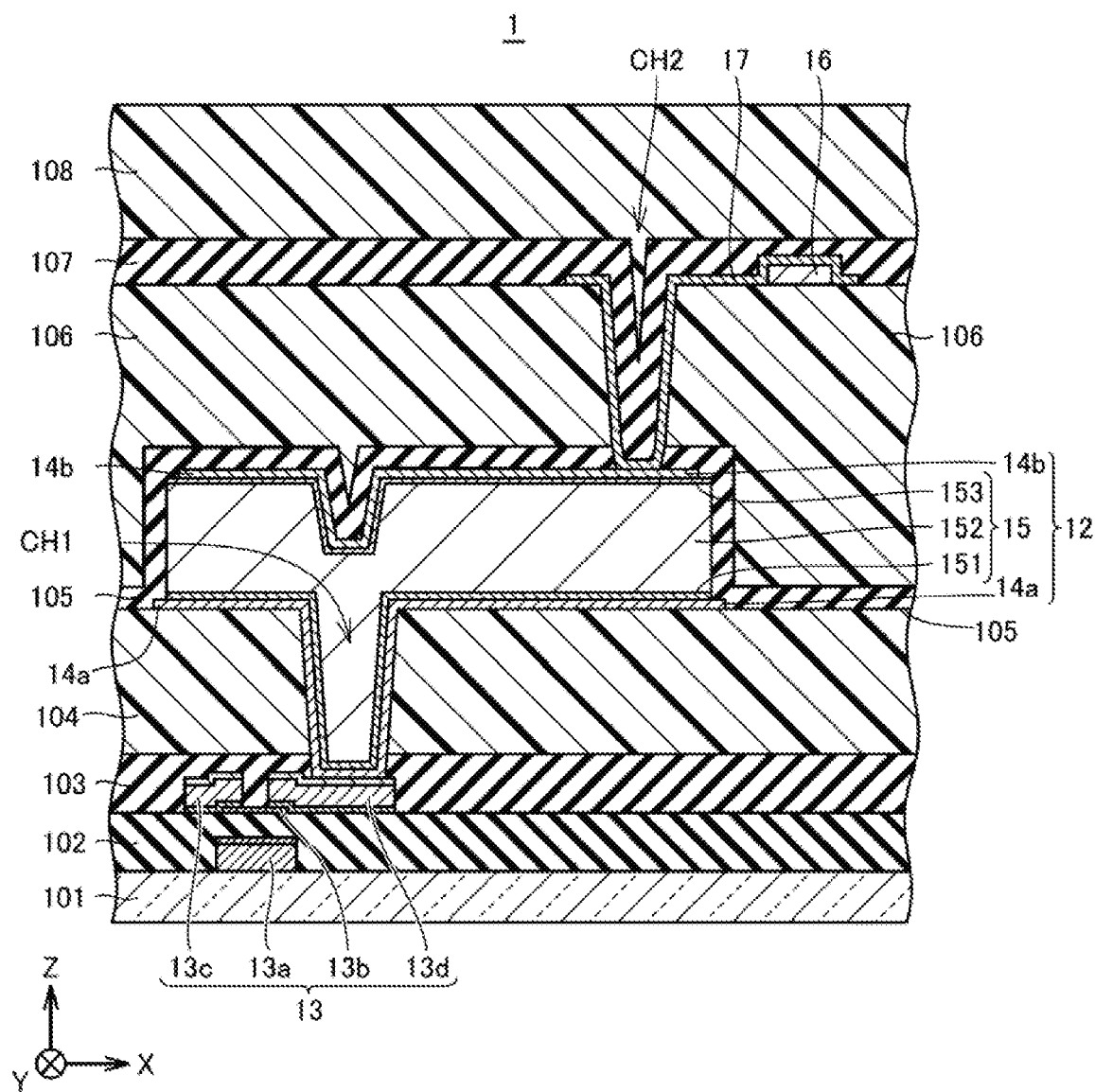
FIG. 4A is a cross-sectional view of the pixel illustrated in FIG. 3, which is taken along the line A-A.

Here, in FIG. 4A, a cross-sectional view of the pixel illustrated in FIG. 3, which is taken along the line A-A, is given. In the following description, a positive side in the Z axis direction illustrated in FIG. 4A, that is, a side on which the X-ray source is provided is referred to as an upper side, and a negative side in the Z axis direction is referred to as a lower side in some cases.

As illustrated in FIG. 4A, each of the elements in the pixel is disposed on one surface of a substrate 101. The substrate 101 is a substrate having insulating properties and is formed of a glass substrate or the like.

On the substrate 101, the gate electrode 13a integrated with the gate wiring line 11 (see FIG. 3) and a gate insulating film 102 are formed.

The gate electrode 13a and the gate wiring line 11 are formed of, for example, a metal such as aluminum (Al), tungsten (W), molybdenum (Mo), molybdenum nitride (MoN), tantalum (Ta), chromium (Cr), titanium (Ti), and copper (Cu), or an alloy thereof, or a metal nitride thereof. In the present embodiment, the gate electrode 13a and the gate wiring line 11 have a layered structure in which a metal film formed of molybdenum nitride and a metal film formed of aluminum are layered in the stated order. For example, the thickness of the metal film formed of molybdenum nitride is approximately 100 nm, and the thickness of the metal film formed of aluminum is approximately 300 nm.

The gate insulating film 102 covers the gate electrode 13a. For example, as the gate insulating film 102, silicon oxide (SiOx), silicon nitride (SiNx), silicon oxynitride (SiOxNy) (x>y), and silicon nitride oxide (SiNxOy) (x>y) may be used. In the present embodiment, the gate insulating film 102 includes a layered film in which silicon oxide (SiOx) and silicon nitride (SiNx) are sequentially layered, and the thickness of the film formed of silicon oxide (SiOx) is approximately 50 nm, and the thickness of the film formed of silicon nitride (SiNx) is approximately 400 nm.

The semiconductor active layer 13b, and the source electrode 13c and the drain electrode 13d that are connected to the semiconductor active layer 13b are formed above the gate electrode 13a through intermediation of the gate insulating film 102.

The semiconductor active layer 13b is formed in contact with the gate insulating film 102. The semiconductor active layer 13b is formed of an oxide semiconductor. For example, as the oxide semiconductor, $InGaO_3(ZnO)_5$, magnesium zinc oxide ($Mg_xZn_{1-x}O$), cadmium zinc oxide ($Cd_xZn_{1-x}O$), cadmium oxide (CdO), or an amorphous oxide semiconductor, which contains indium (In), gallium (Ga), and zinc (Zn) at a predetermined ratio, may be used. In the present embodiment, the semiconductor active layer 13b is formed of an amorphous oxide semiconductor containing indium (In), gallium (Ga), and zinc (Zn) at a predetermined ratio, and the thickness of the film is, for example, approximately 70 nm.

The source electrode 13c and the drain electrode 13d are disposed in contact with a part of the semiconductor active layer 13b on the gate insulating film 102. The source electrode 13c is integrated with the source wiring line 10 (see FIG. 3). The drain electrode 13d is connected to the lower electrode 14a in the contact hole CH1.

The source electrode 13c and the drain electrode 13d are formed on the same layer, and are formed of, for example, a metal such as aluminum (Al), tungsten (W), molybdenum (Mo), tantalum (Ta), chromium (Cr), titanium (Ti), and copper (Cu), or an alloy thereof, or a metal nitride thereof. Further, as materials of the source electrode 13c and the drain electrode 13d, a transparent material such as indium tin oxide (ITO), indium zinc oxide (IZO), indium tin oxide containing silicon oxide (ITSO), indium oxide ($In_2O_3$), tin oxide ($SnO_2$), zinc oxide (ZnO), and titanium nitride, or a material obtained by combining those as appropriate may be used.

For example, the source electrode 13c and the drain electrode 13d may be obtained by layering a plurality of metal films. Specifically, the source electrode 13c and the drain electrode 13d have a layered structure in which a metal film formed of molybdenum nitride (MoN), a metal film formed of aluminum (Al), and a metal film formed of molybdenum nitride (MoN) are layered in the stated order. The thickness of the lower film formed of molybdenum nitride (MoN) is approximately 100 nm, the thickness of the film formed of aluminum (Al) is approximately 500 nm, and the thickness of the upper film formed of molybdenum nitride (MoN) is approximately 50 nm.

A first insulating film 103 is provided covering the source electrode 13c and the drain electrode 13d. The first insulating film 103 may have a single layer structure formed of silicon oxide ($SiO_2$) or silicon nitride (SiN) or may have a layered structure in which silicon nitride (SiN) and silicon oxide ($SiO_2$) are layered in the stated order.

A second insulating film 104 is formed on the first insulating film 103. The contact hole CH1 is formed on the drain electrode 13d. The contact hole CH1 passes through the second insulating film 104 and the first insulating film 103. The second insulating film 104 is formed of an organic transparent resin such as an acrylic resin and a siloxane resin, and the thickness of the film is, for example, approximately 2.5 μm.

The lower electrode 14a is formed on the second insulating film 104. The lower electrode 14a is connected to the drain electrode 13d in a contact hole CH1. The lower electrode 14a includes, for example, a metal film containing molybdenum nitride (MoN), and the thickness of the film is, for example, 200 nm.

The photoelectric conversion layer 15 is formed on the lower electrode 14a. The photoelectric conversion layer 15 is formed by sequentially layering an n-type amorphous semiconductor layer 151, an intrinsic amorphous semiconductor layer 152, and a p-type amorphous semiconductor layer 153. In this example, the length of the photoelectric conversion layer 15 in the X axis direction is less than the length of the lower electrode 14a in the X axis direction.

The n-type amorphous semiconductor layer 151 is formed of amorphous silicon to which n-type impurities (phosphorus or the like) are doped. The thickness of the n-type amorphous semiconductor layer 151 is, for example, approximately 30 nm.

The intrinsic amorphous semiconductor layer 152 is formed of intrinsic amorphous silicon. The intrinsic amorphous semiconductor layer 152 is formed in contact with the n-type amorphous semiconductor layer 151. The thickness of the intrinsic amorphous semiconductor layer 152 is, for example, approximately 1000 nm.

The p-type amorphous semiconductor layer 153 is formed of amorphous silicon to which p-type impurities (boron or the like) are doped. The p-type amorphous semiconductor layer 153 is formed in contact with the intrinsic amorphous semiconductor layer 152. The thickness of the p-type amorphous semiconductor layer 153 is, for example, 5 nm.

Figure 4B:
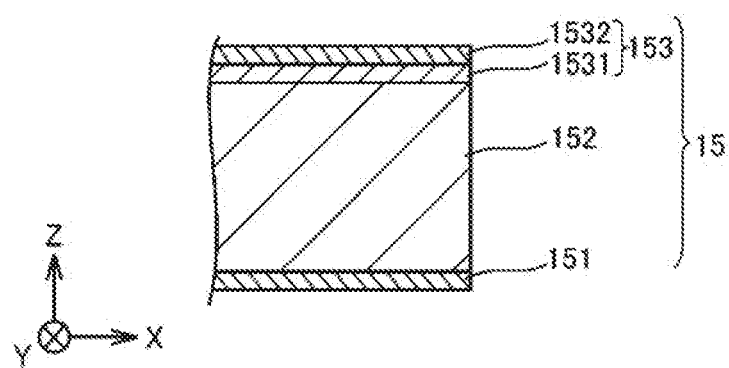
FIG. 4B is an enlarged schematic diagram of a part of a p-type amorphous semiconductor layer illustrated in FIG. 4A.

Here, in FIG. 4B, an enlarged cross-sectional view of a part of the photoelectric conversion layer 15 in FIG. 4A is given. As illustrated in FIG. 4B, the p-type amorphous semiconductor layer 153 in the photoelectric conversion layer 15 includes two layers including a first p-type amorphous semiconductor layer 1531 and a second p-type amorphous semiconductor layer 1532.

The first p-type amorphous semiconductor layer 1531 has a dopant concentration less than that of the second p-type amorphous semiconductor layer 1532. A greater dopant concentration indicates a greater extinction coefficient. That is, in the present embodiment, an extinction coefficient of the p-type amorphous semiconductor layer 153 is less in the first p-type amorphous semiconductor layer 1531 than in the second p-type amorphous semiconductor layer 1532. Thus, free electrons are more likely to be bound in the second p-type amorphous semiconductor layer 1532 as compared to the first p-type amorphous semiconductor layer 1531, and hence a leakage current is less likely to flow between the upper electrode 14b and the second p-type amorphous semiconductor layer 1532. Further, light transmittance of the p-type amorphous semiconductor layer 153 is improved, and hence quantum efficiency is improved. Note that, the second p-type amorphous semiconductor layer 1532 has a dopant concentration greater than that of the first p-type amorphous semiconductor layer 1531, and hence has specific resistance less than that of the first p-type amorphous semiconductor layer 1531.

In the present embodiment, it is preferred that the p-type amorphous semiconductor layer 153 have an extinction coefficient ranging from 0.040 to 0.250, and it is preferred that a difference between the extinction coefficients of the first p-type amorphous semiconductor layer 1531 and the second p-type amorphous semiconductor layer 1532 be 0.005 or greater. In this example, for example, the dopant concentrations of the first p-type amorphous semiconductor layer 1531 and the second p-type amorphous semiconductor layer 1532 are adjusted so that the first p-type amorphous semiconductor layer 1531 has an extinction coefficient of 0.075 and the second p-type amorphous semiconductor layer 1532 has an extinction coefficient of 0.150.

Referring back to FIG. 4A, the upper electrode 14b is provided on the p-type amorphous semiconductor layer 153. In this example, the width of the upper electrode 14b in the X axis direction is less than the width of the p-type amorphous semiconductor layer 15. Further, in this example, the upper electrode 14b includes, for example, a transparent conductive film formed of Indium Tin Oxide (ITO), and the thickness of the upper electrode 14b is approximately 70 nm.

A third insulating film 105 is provided on the second insulating film 104 covering the surface of the photodiode 12. The third insulating film 105 has an opening 105a at a position overlapping with the upper electrode 14b in a plan view. The third insulating film 105 is an inorganic insulating film formed of, for example, silicon nitride (SiN), and the thickness thereof is, for example, approximately 300 nm.

A fourth insulating film 106 is provided on the third insulating film 105. The fourth insulating film 106 has an opening 106a at a position overlapping with the opening 105a of the third insulating film 105 in a plan view. The contact hole CH2 includes the openings 105a and 106a.

The fourth insulating film 106 includes an organic insulating film formed of an organic transparent resin such as an acrylic resin and a siloxane resin. The thickness of the fourth insulating film 106 is, for example, approximately 2.5 μm.

The bias wiring line 16 and a conductive film 17 that covers the bias wiring line 16 are formed on the fourth insulating film 106.

The bias wiring line 16 has a layered structure in which a metal film 161 formed of molybdenum nitride (MoN), a metal film 162 formed of aluminum (Al), and a metal film 163 formed of titanium (Ti) are sequentially layered, for example. The thickness of the films formed of molybdenum nitride (MoN), aluminum (Al), and titanium (Ti) are, for example, approximately 100 nm, 300 nm, and 50 nm, respectively.

The conductive film 17 is connected to the bias wiring line 16 and is connected to the upper electrode 14b in the contact hole CH2. In this example, the conductive film 17 includes, for example, a transparent conductive film formed of Indium Tin Oxide (ITO), and the thickness of the conductive film 17 is approximately 70 μm.

The bias wiring line 16 is connected to the controller 2 (see FIG. 1). The bias wiring line 16 allows a bias voltage, which is input from the controller 2, to be applied to the upper electrode 14b via the conductive film 17.

A fifth insulating film 107 is provided on the fourth insulating film 106 covering the conductive film 17. The fifth insulting film 107 includes an inorganic insulating film formed of, for example, silicon nitride (SiN). The thickness of the fifth insulting film 107 is, for example, approximately 200 nm.

A sixth insulating film 108 is provided on the fifth insulting film 107. In this example, the sixth insulating film 108 includes an organic insulating film formed of an organic transparent resin film such as an acrylic resin and a siloxane resin. The thickness of the sixth insulating film 108 is, for example, approximately 2.0 μm.

Manufacturing Method of Imaging Panel 1

Figure 5A:
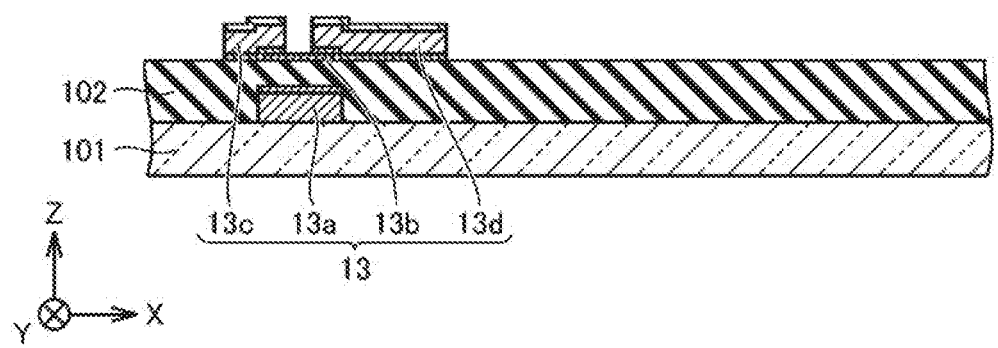
FIG. 5A is a cross-sectional view illustrating a step of forming a gate insulating film and a TFT on a substrate, which is a manufacturing step of the imaging panel illustrated in FIG. 4A.

Next, a description is made on a manufacturing method of the imaging panel 1. Each of FIG. 5A to FIG. 5R is a cross-sectional view of a manufacturing step of the imaging panel 1 (taken along the line A-A in FIG. 3).

Figure 5B:
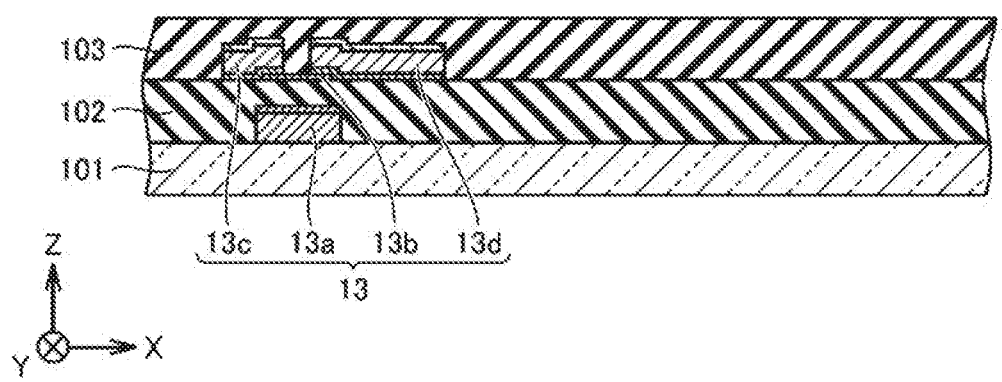
FIG. 5B is a cross-sectional view illustrating a step of forming a first insulating film that covers the gate insulating film and the TFT illustrated in FIG. 5A.

First, the gate insulating film 102 and the TFT 13 are formed on the substrate 101 through use of a known method (see FIG. 5A), and the first insulating film 103 formed of silicon nitride (SiN) is formed so as to cover the TFT 13 through use of, for example, a plasma CVD method (see FIG. 5B).

Figure 5C:
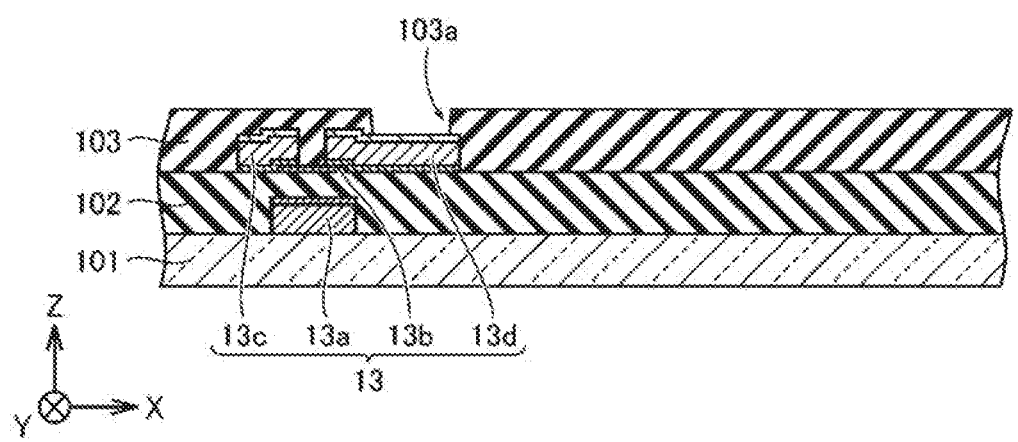
FIG. 5C is a cross-sectional view illustrating a step of forming an opening of the first insulating film illustrated in FIG. 5B.

Subsequently, the entire surface of the substrate 101 is subjected to heating treatment at approximately 350° C., a photolithographic method and wet etching are performed, and the first insulating film 103 is patterned. In this manner, an opening 103a is formed on the drain electrode 13d (see FIG. 5C).

Figure 5D:
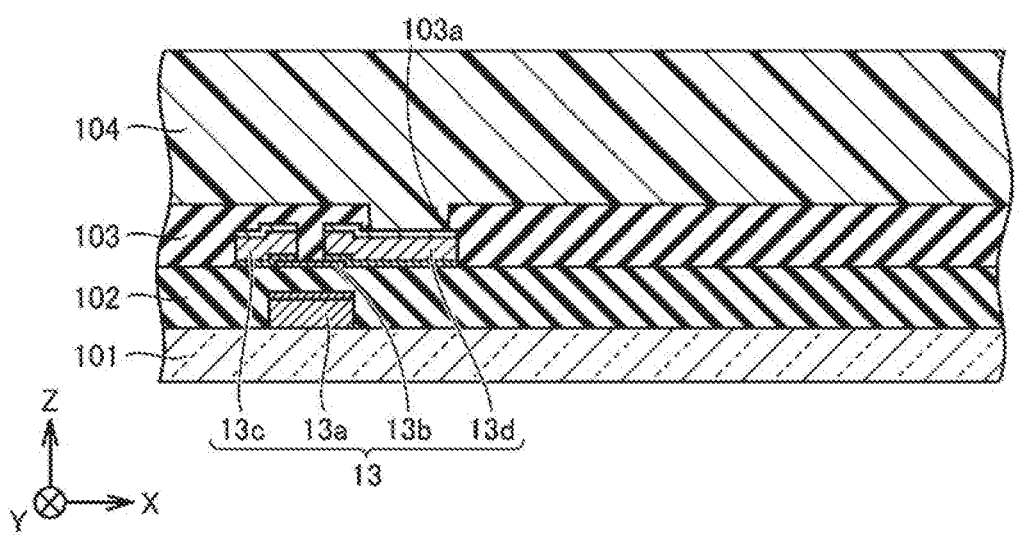
FIG. 5D is a cross-sectional view illustrating a step of forming a second insulating film on the first insulating film in FIG. 5C.

Next, the second insulating film 104 formed of an acrylic resin or a siloxane resin is formed on the first insulating film 103 through use of, for example, a slit coating method (see FIG. 5D).

Figure 5E:
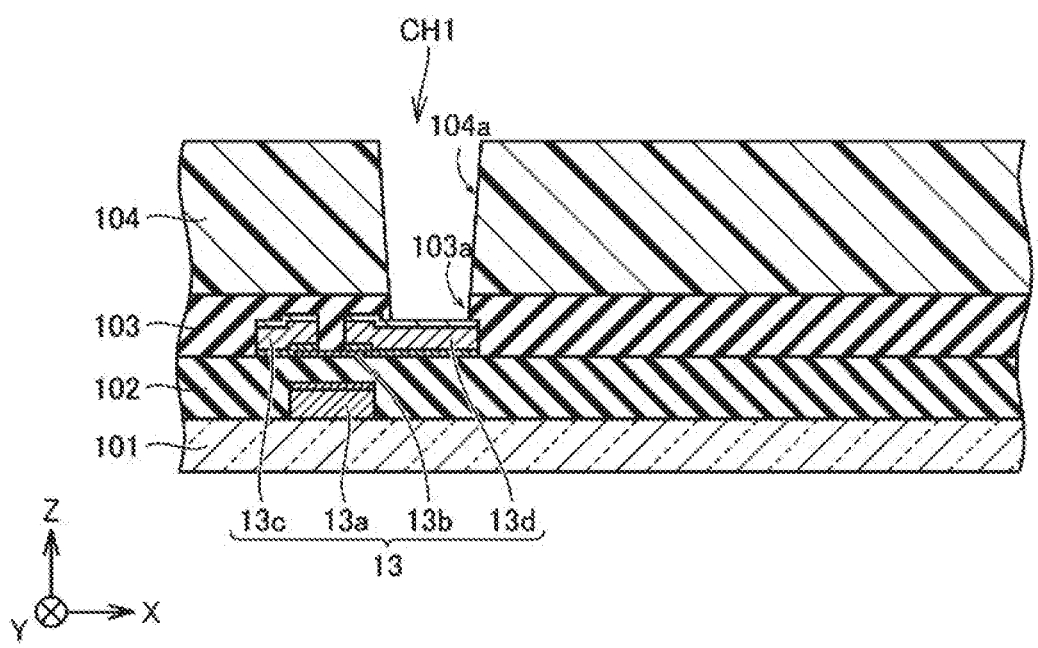
FIG. 5E is a cross-sectional view illustrating a step of forming an opening of the second insulating film in FIG. 5D to form a contact hole CH1.

Further, through use of the photolithographic method, an opening 104a of the second insulating film 104 is formed at a position overlapping with the opening 103a in a plan view. As a result, the contact hole CH1 including the openings 103a and 104a is formed (see FIG. 5E).

Figure 5F:
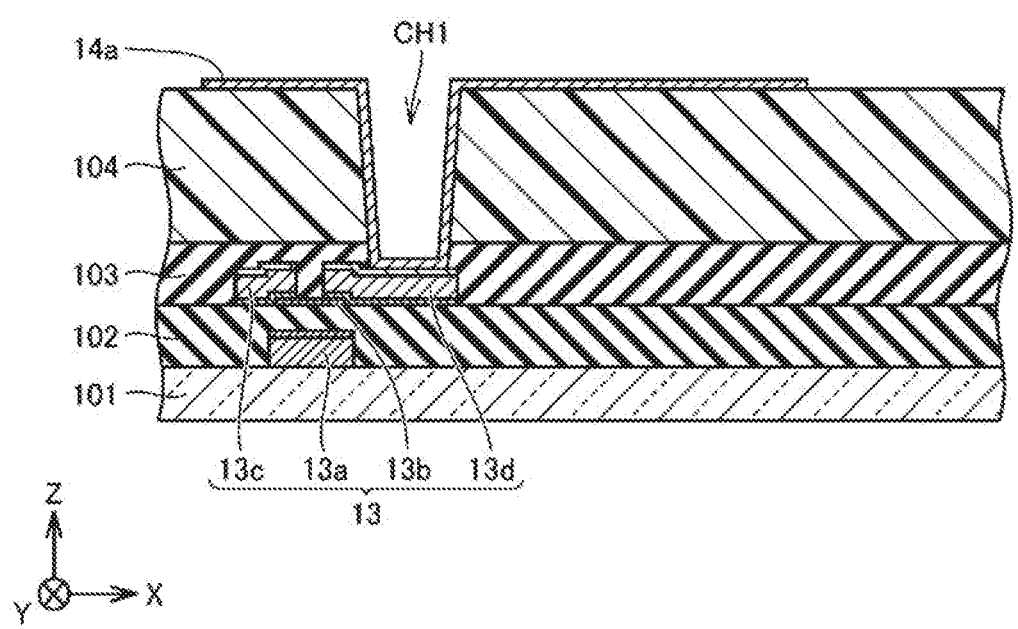
FIG. 5F is a cross-sectional view illustrating a step of forming a lower electrode on the second insulating film in FIG. 5E.
Figure 5G:
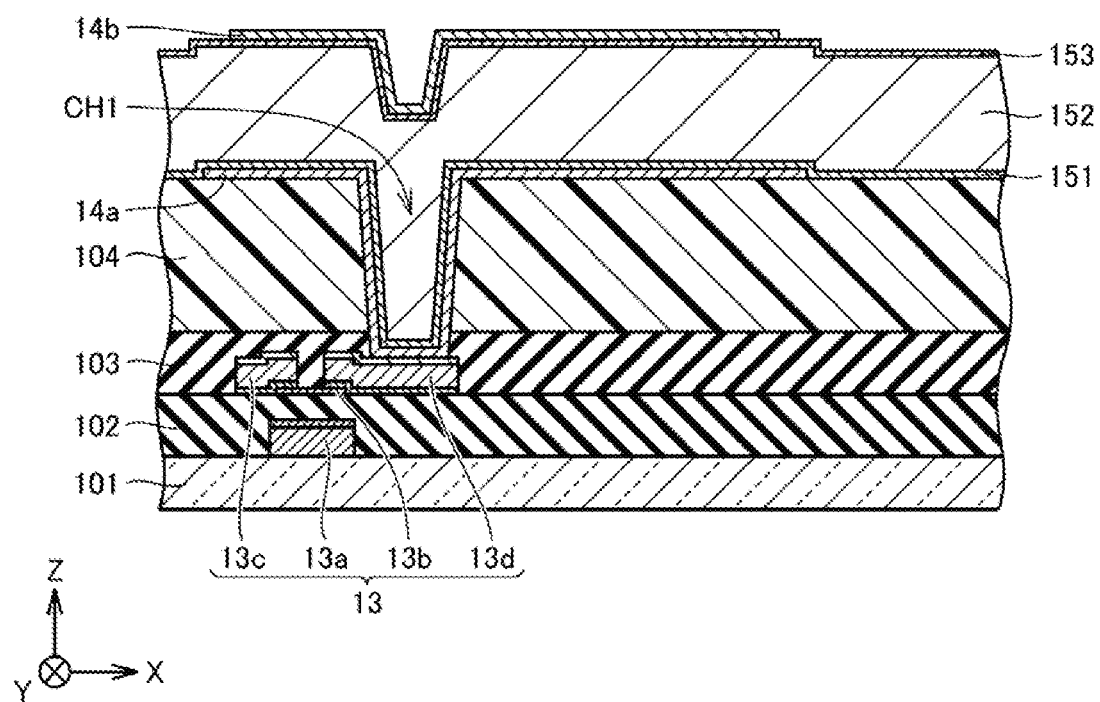
FIG. 5G is a cross-sectional view illustrating a step of forming an n-type amorphous semiconductor layer, an intrinsic amorphous semiconductor layer, and a p-type amorphous semiconductor layer that cover the lower electrode illustrated in FIG. 5F, and forming an upper electrode on the p-type amorphous semiconductor layer.

Subsequently, a metal film formed of molybdenum nitride (MoN) is formed on the second insulating film 104 through use of, for example, sputtering. After that, the photolithographic method and wet etching are performed, and the metal film is patterned. As a result, the lower electrode 14a, which is connected to the drain electrode 13d in the contact hole CH1, is formed on the second insulating film 104 (see FIG. 5F).

Next, the n-type amorphous semiconductor layer 151, the intrinsic amorphous semiconductor layer 152, and the p-type amorphous semiconductor layer 153 including the first p-type amorphous semiconductor layer 1531 and the second p-type amorphous semiconductor layer 1532 are sequentially formed through use of, for example, the plasma CVD method, so as to cover the second insulating film 104 and the lower electrode 14a. After that, a transparent conductive film formed of ITO is formed on the p-type amorphous semiconductor layer 153 through use of, for example, sputtering. After that, the photolithographic method and dry etching are performed, and the transparent conductive film is patterned. As a result, the upper electrode 14b is formed.

In the present embodiment, in a case that the p-type amorphous semiconductor layer 153 is formed, a distance between electrodes in a reaction chamber of a plasma CVD device, a pressure and a temperature in the reaction chamber, and a radio frequency (RF) power are controlled to be approximately 20 mm, approximately 200 Pa, approximately 200° C., and approximately 100 W, respectively. In this example, as reaction gas, $SiH_4$ gas, $B_2H_6$ gas, and $H_2$ gas are used. A ratio of those types of reaction gas are adjusted in accordance with an extinction coefficient.

The extinction coefficient depends on a gas flow ratio of the $B_2H_6$ gas with respect to the entire flow amount of the reaction gas, and a p-type amorphous semiconductor layer having a greater extinction coefficient is formed as the gas flow ratio of the $B_2H_6$ gas is greater. In the present embodiment, regarding a flow amount of each gas in the reaction gas used at the time of forming the first p-type amorphous semiconductor layer 1531, the $SiH_4$ gas, the $B_2H_6$ gas (with a $B_2H_6$ concentration of 1% obtained by dilution with the $H_2$ gas), and the $H_2$ gas are adjusted to approximately 240 sccm, approximately 100 sccm, approximately 860 sccm, respectively. Further, regarding a flow amount of each gas in the reaction gas used at the time of forming the second p-type amorphous semiconductor layer 1532, the $SiH_4$ gas, the $B_2H_6$ gas (with a $B_2H_6$ concentration of 1% obtained by dilution with the $H_2$ gas), and the $H_2$ gas are adjusted to approximately 240 sccm, approximately 500 sccm, approximately 460 sccm, respectively.

As described above, the gas flow ratio of the $B_2H_6$ gas with respect to the entire flow amount of the reaction gas at the time of forming the p-type amorphous semiconductor layer 153 is set greater for the second p-type amorphous semiconductor layer 1532 as compared to the first p-type amorphous semiconductor layer 1531. As a result, the p-type amorphous semiconductor layer 153 in which the first p-type amorphous semiconductor layer 1531 and the second p-type amorphous semiconductor layer 1532 having different extinction coefficients and different dopant concentrations are layered is formed.

Figure 5H:
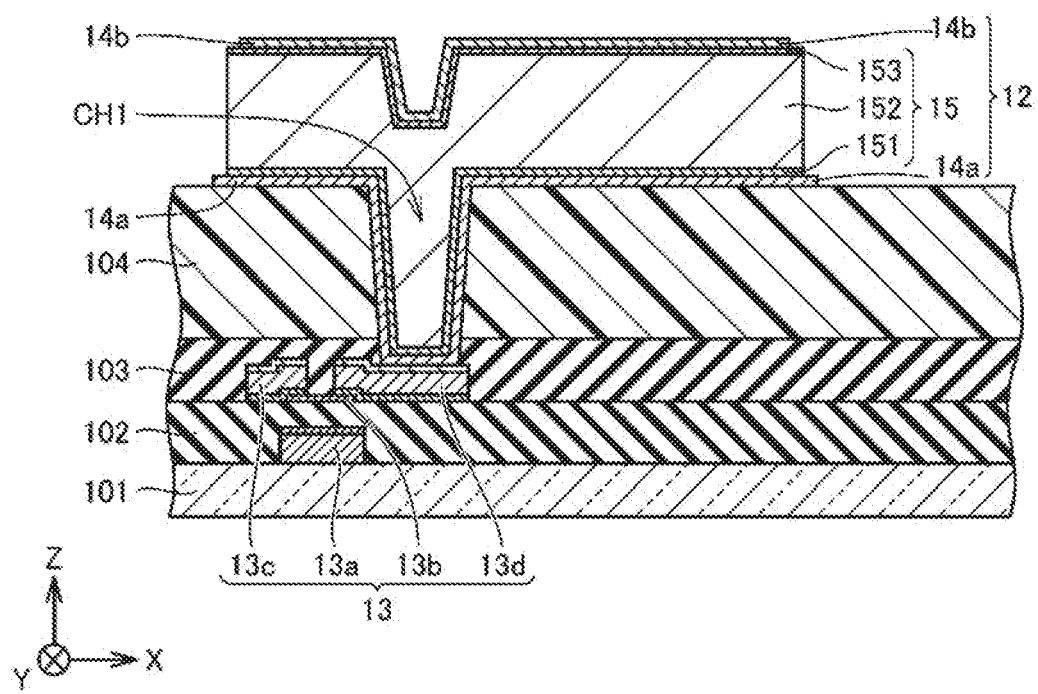
FIG. 5H is a cross-sectional view illustrating a step of forming a photoelectric conversion layer by patterning the n-type amorphous semiconductor layer, the intrinsic amorphous semiconductor layer, and the p-type amorphous semiconductor layer in FIG. 5G.

Subsequently, the n-type amorphous semiconductor layer 151, the intrinsic amorphous semiconductor layer 152, and the p-type amorphous semiconductor layer 153 are patterned by performing the photolithographic method and dry etching. In this manner, the photoelectric conversion layer 15 is formed, and the photodiode 12 is formed (see FIG. 5H).

Figure 5I:
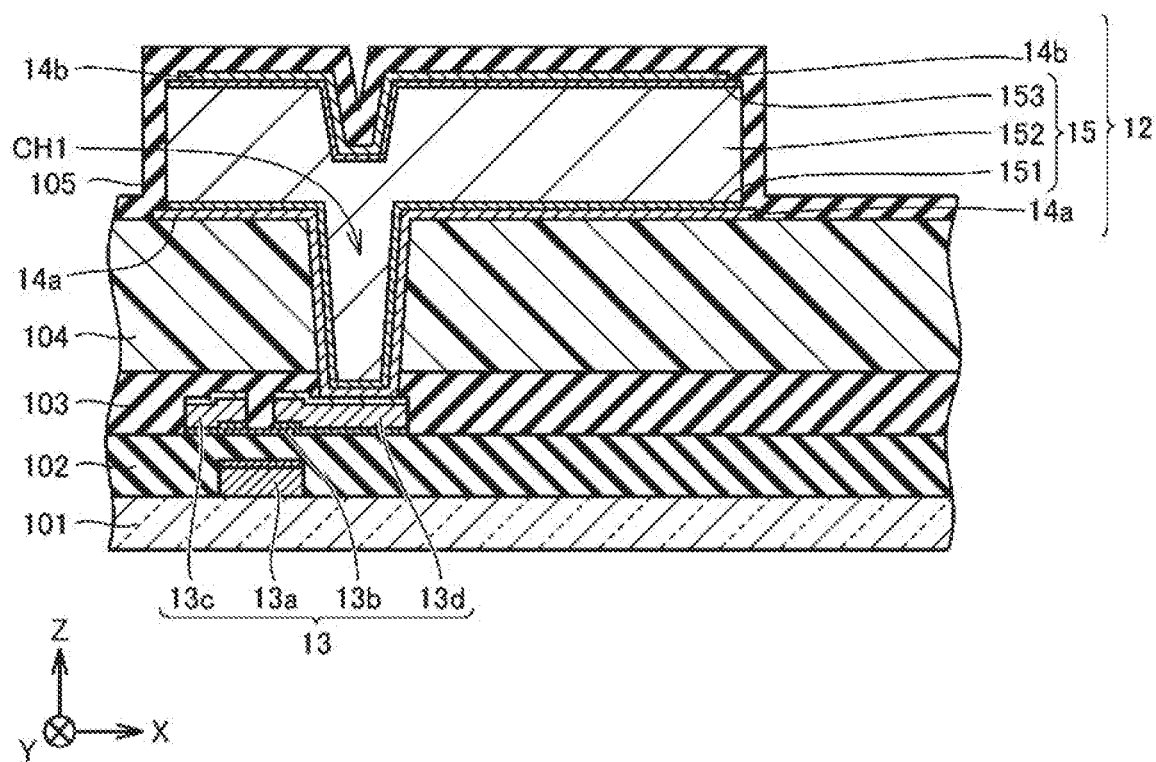
FIG. 5I is a cross-sectional view illustrating a step of forming a third insulating film that covers the photoelectric conversion layer in FIG. 5H.
Figure 5J:
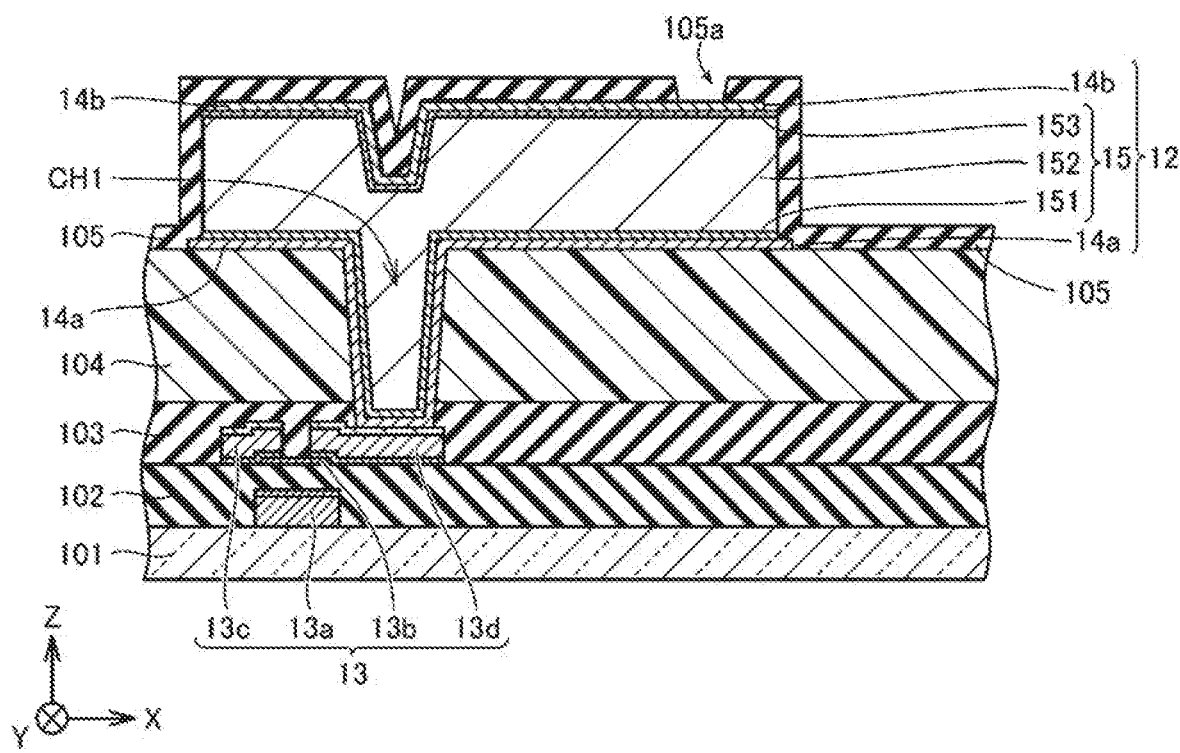
FIG. 5J is a cross-sectional view illustrating a step of forming an opening of the third insulating film in FIG. 5H.

Next, the third insulating film 105 formed of silicon nitride (SiN) is formed so as to cover the surface of the photodiode 12 through use of, for example, the plasma CVD method (see FIG. 5I). After that, the photolithographic method and wet etching are performed, and the third insulating film 105 is patterned (see FIG. 5J). As a result, the opening 105a of the third insulating film 105 is formed at a position overlapping with the p-type amorphous semiconductor layer 153 in a plan view.

Figure 5K:
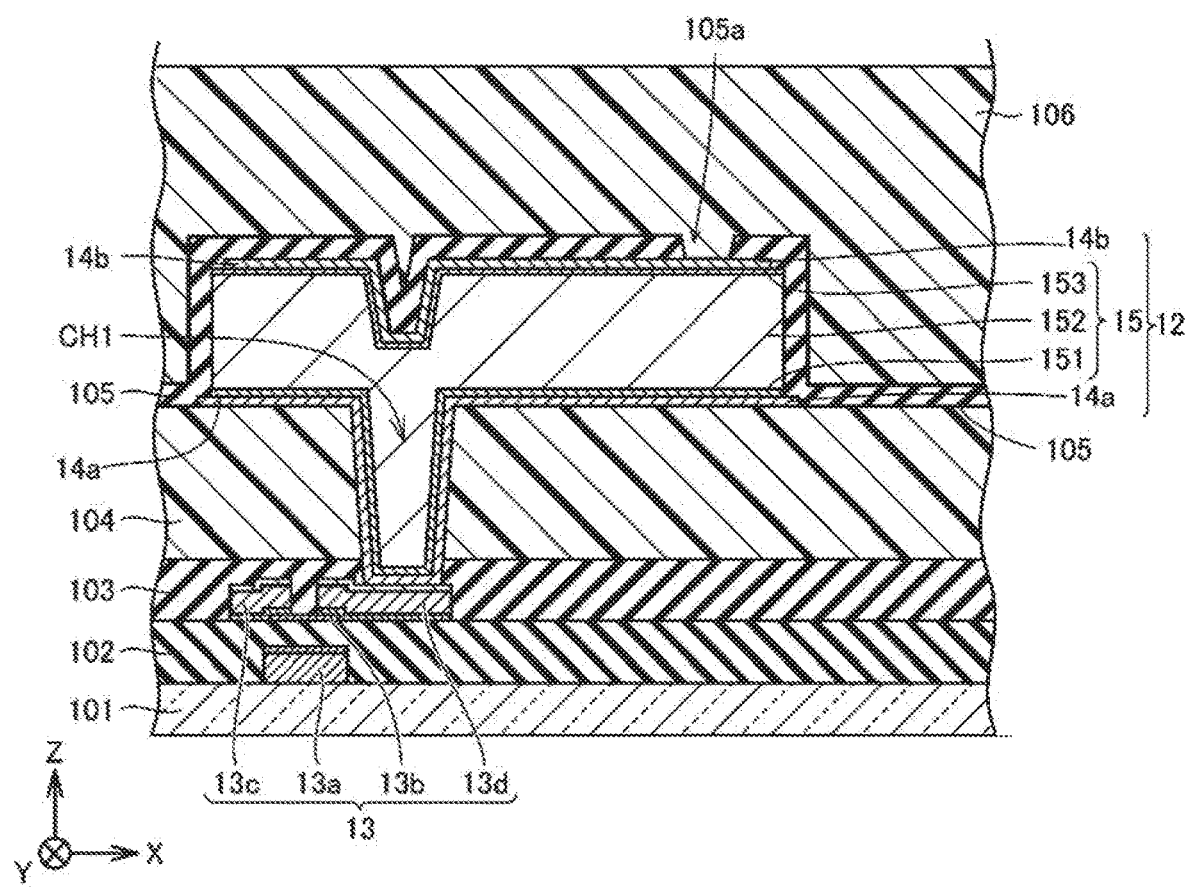
FIG. 5K is a cross-sectional view illustrating a step of forming a fourth insulating film that covers the third insulting film and the photoelectric conversion layer in FIG. 5J.

Subsequently, the fourth insulating film 106 formed of an acrylic resin or a siloxane resin is formed so as to cover the third insulating film 105 through use of, for example, the slit coating method (see FIG. 5K).

Figure 5L:
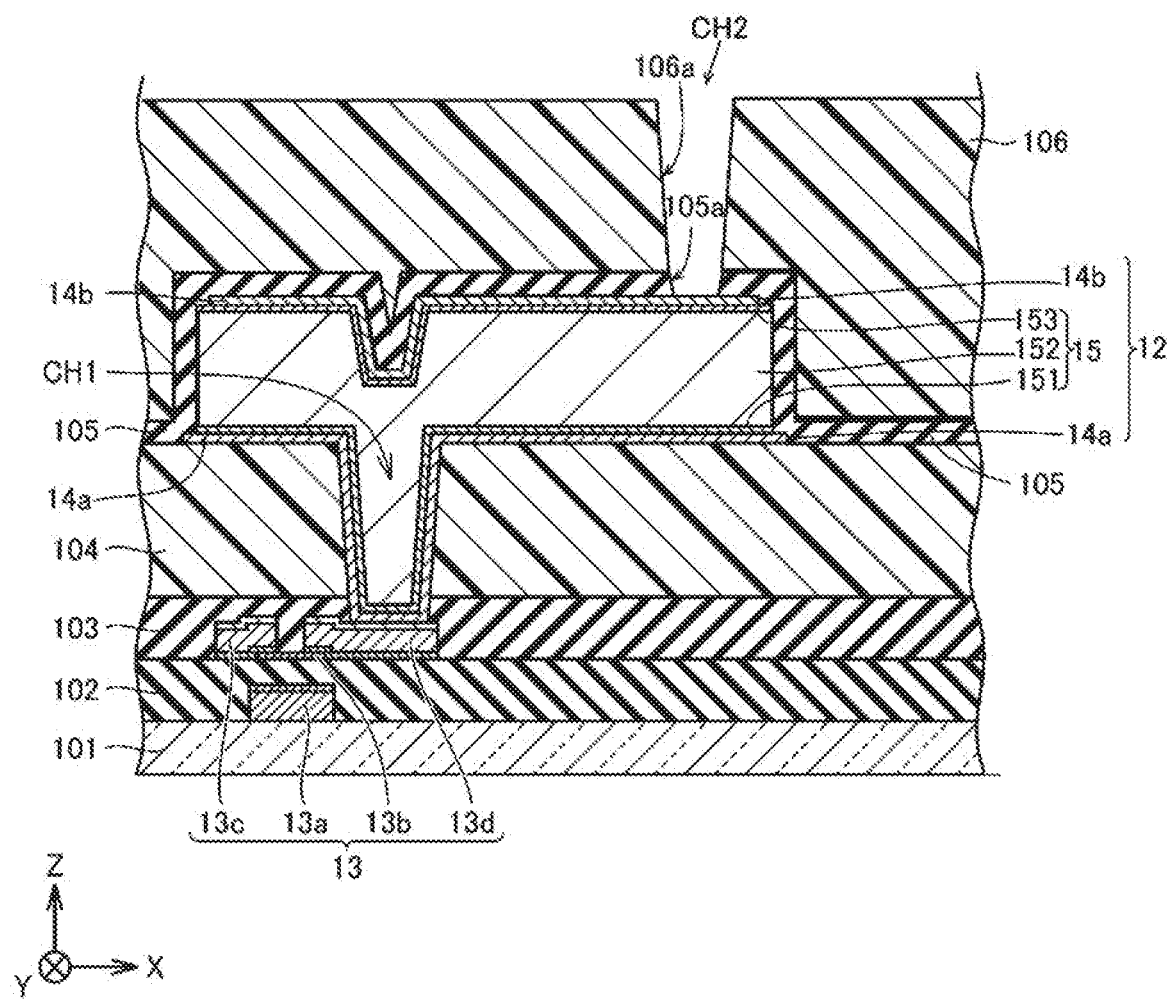
FIG. 5L is a cross-sectional view illustrating a step of forming an opening of the fourth insulating film in FIG. 5K to form a contact hole CH2.

Next, through use of the photolithographic method, the opening 106a of the fourth insulating film 106 is formed at a position overlapping with the opening 105a of the third insulating film 105 in a plan view. In this manner, the contact hole CH2 including the opening 105a and the opening 106a is formed (see FIG. 5L).

Figure 5M:
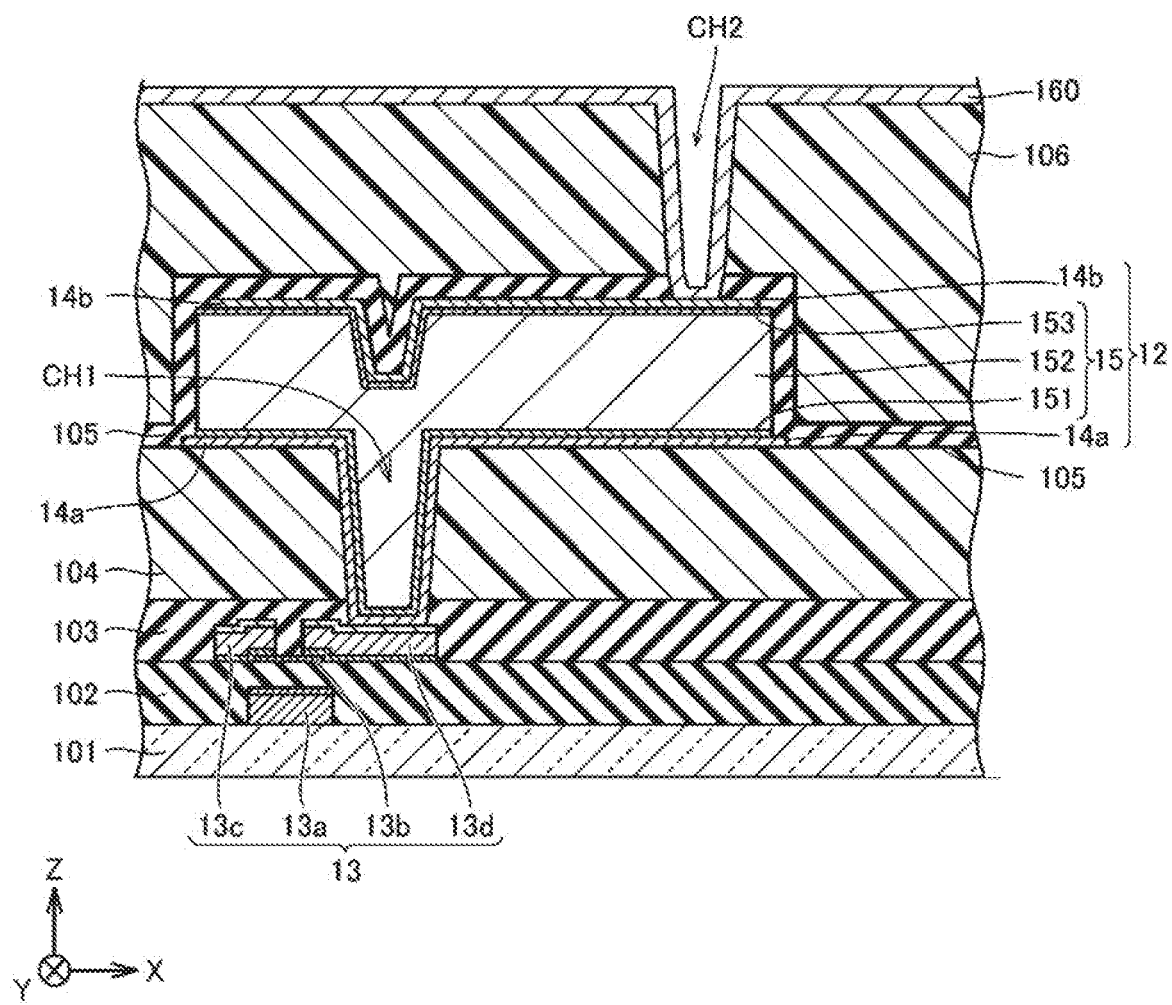
FIG. 5M is a cross-sectional view illustrating a step of forming a metal film being a bias wiring line that covers surfaces of the fourth insulating film and the photoelectric conversion layer in FIG. 5L.
Figure 5N:
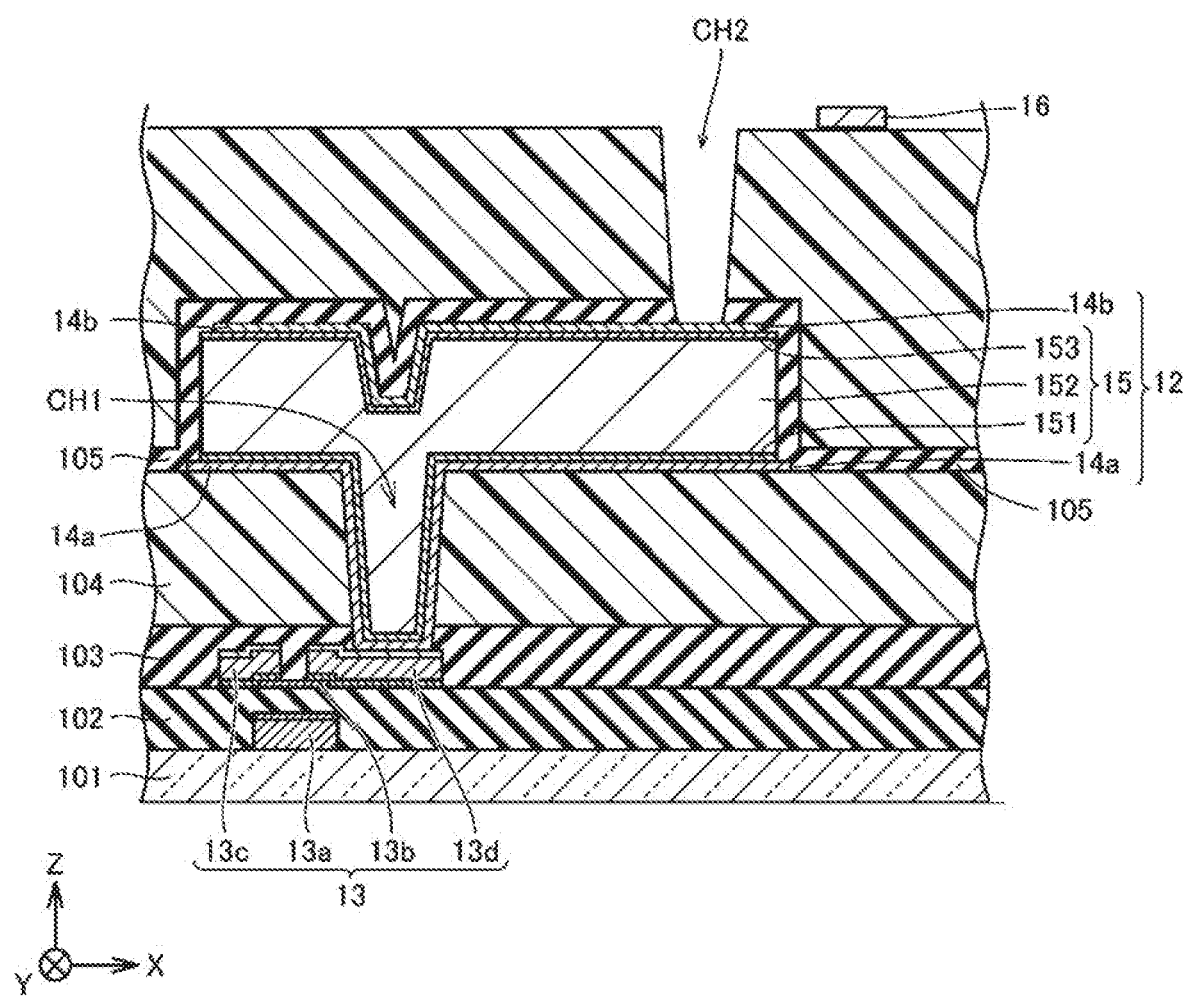
FIG. 5N is a cross-sectional view illustrating a step of forming a bias wiring line by patterning the metal film as a bias wiring line in FIG. 5M.

Subsequently, a metal film 160 in which molybdenum nitride (MoN), aluminum (Al), and titanium (Ti) are sequentially layered is formed so as to cover the fourth insulating film 106 and the contact hole CH2 through use of, for example, sputtering (see FIG. 5M). Further, the photolithographic method and wet etching are performed, and the metal film 160 is patterned (see FIG. 5N). As a result, the bias wiring line 16 is formed at a position not overlapping with the photoelectric conversion layer 15 in a plan view.

Figure 5O:
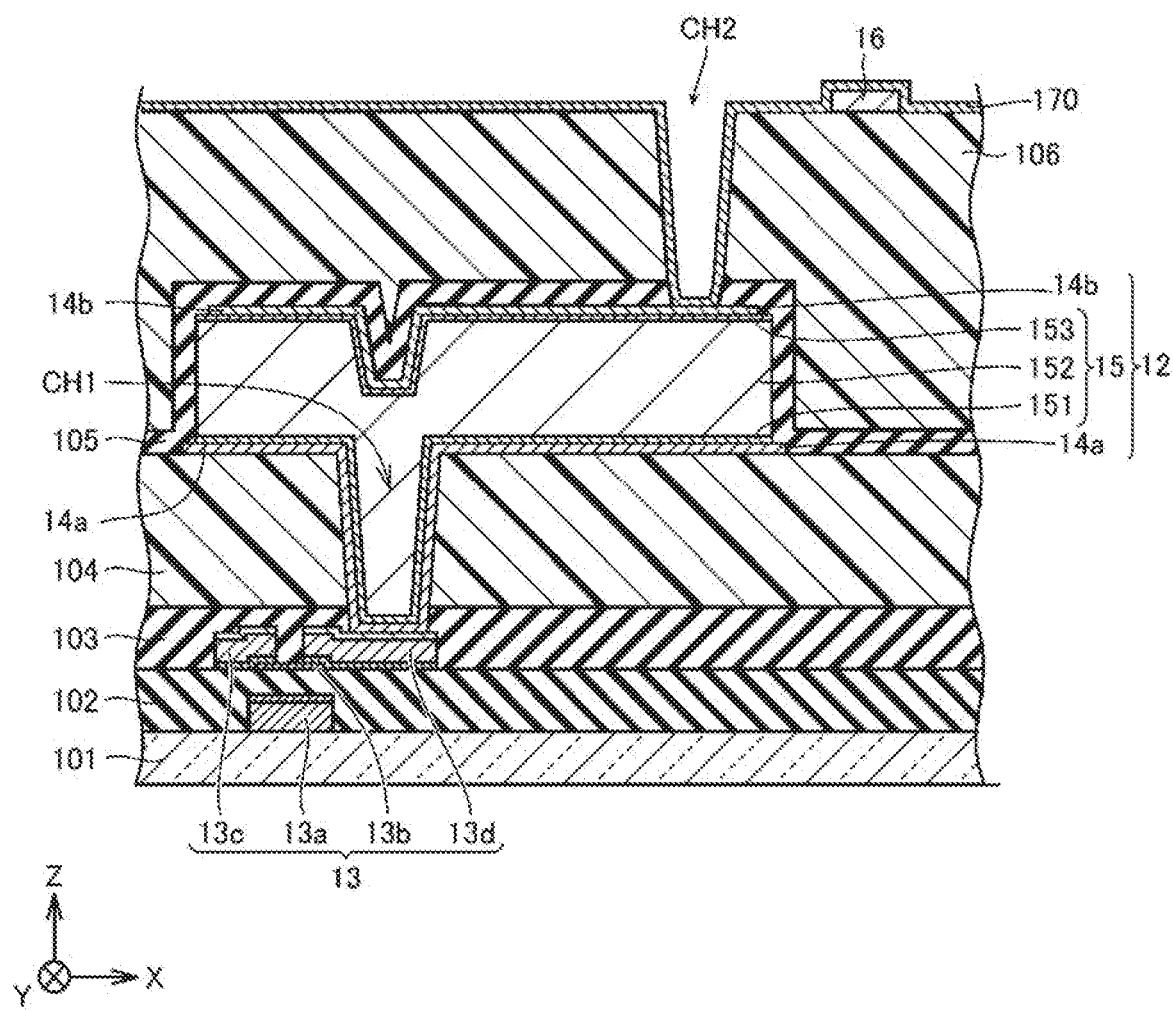
FIG. 5O is a cross-sectional view illustrating a step of forming a transparent conductive film that covers surfaces of the bias wiring line and the photoelectric conversion layer in FIG. 5N.
Figure 5P:
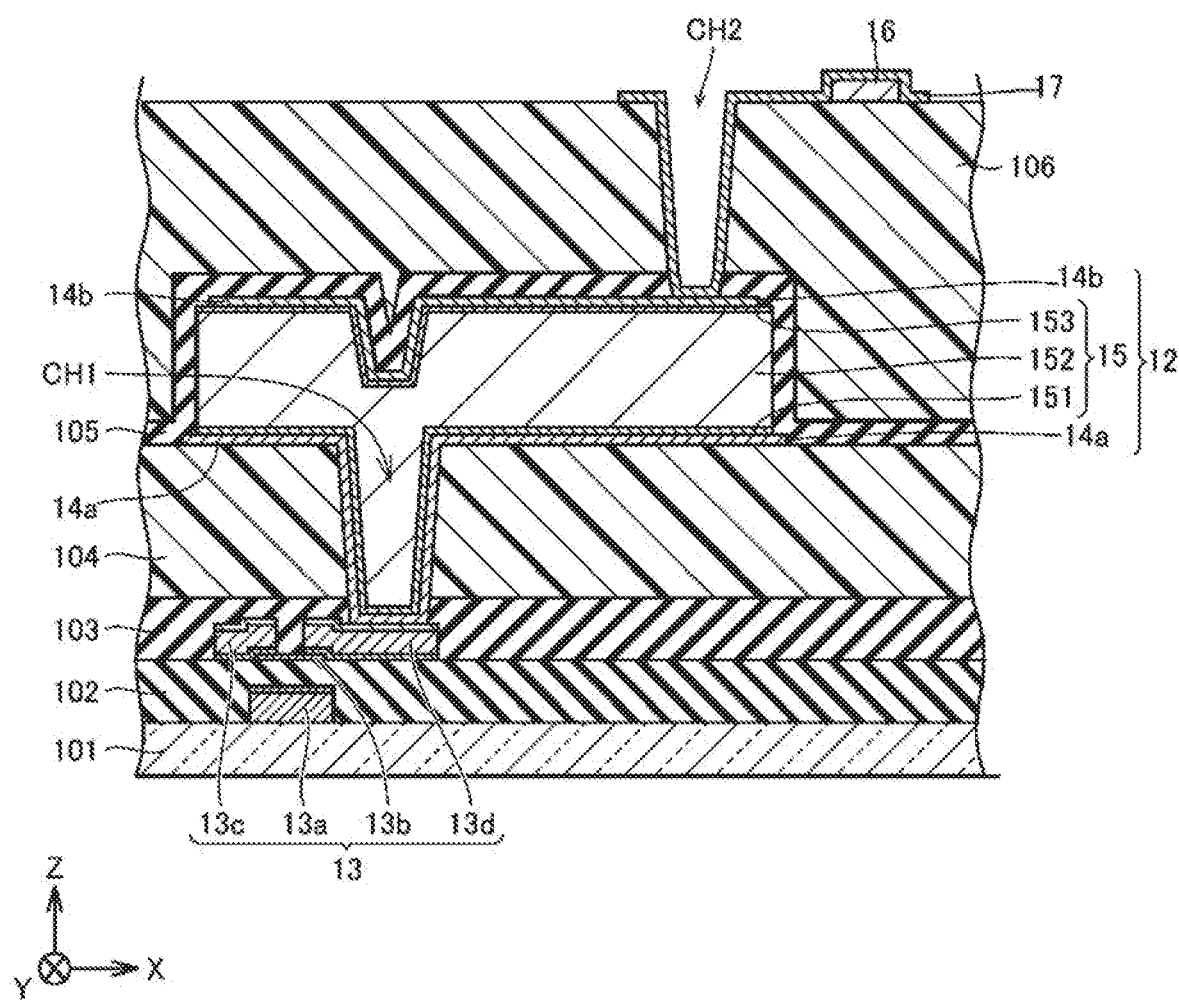
FIG. 5P is a cross-sectional view illustrating a step of forming a conductive film that is connected to the bias wiring line and the upper electrode, by patterning the transparent conductive film in FIG. 5O.

Next, a transparent conductive film 170 formed of ITO is formed so as to cover the fourth insulating film 106, the contact hole CH2, and the bias wiring line 16 through use of, for example, sputtering (see FIG. 5O). Then, the photolithographic method and dry etching are performed, and the transparent conductive film 170 is patterned (see FIG. 5P). As a result, the conductive film 17, which is connected to the bias wiring line 16 and is also connected to the upper electrode 14b in the contact hole CH2, is formed.

Figure 5Q:
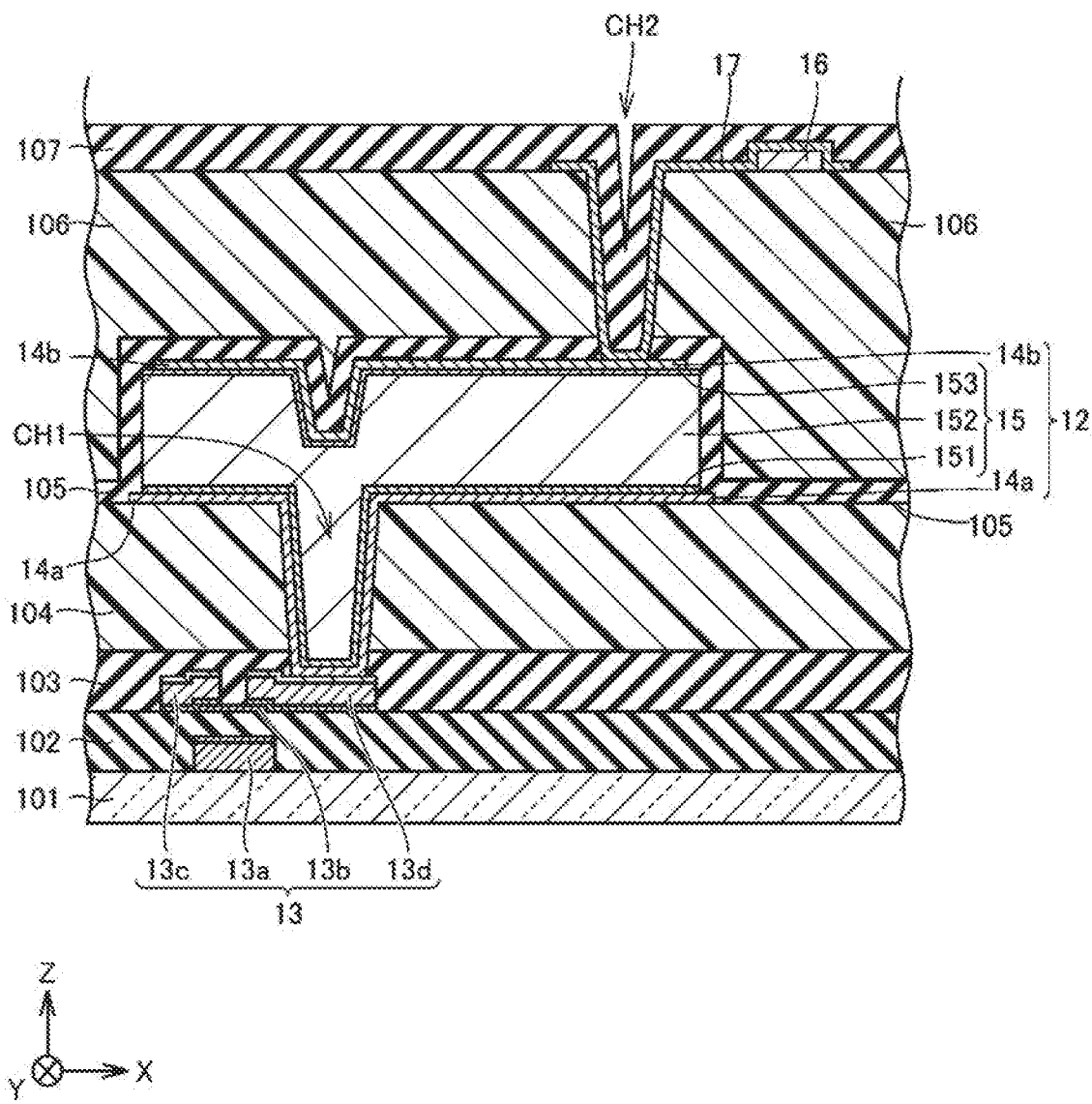
FIG. 5Q is a cross-sectional view illustrating a step of forming a fifth insulating film that covers a surface of the conductive film in FIG. 5P.
Figure 5R:
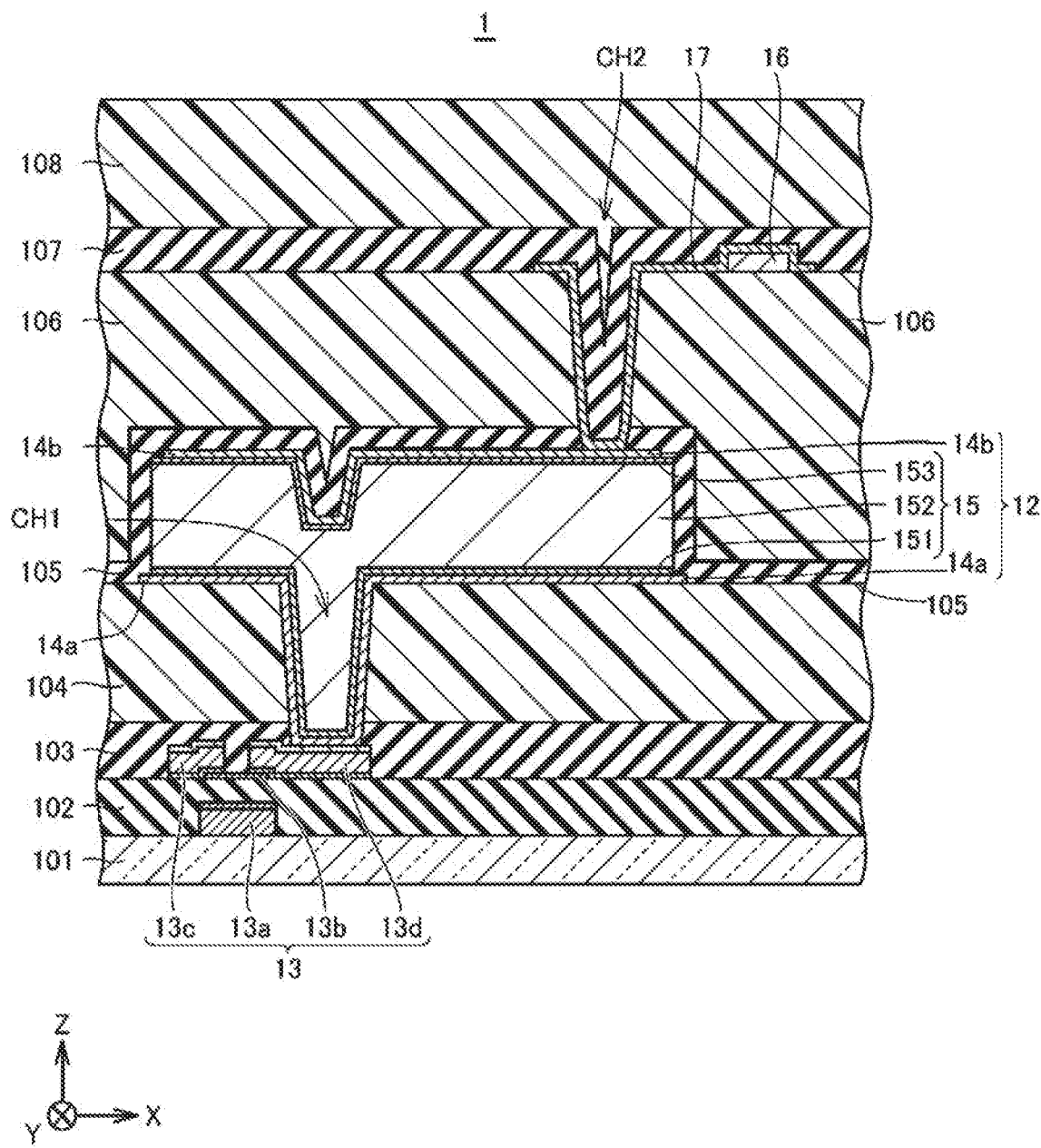
FIG. 5R is a cross-sectional view illustrating a step of forming a sixth insulating film that covers the fifth insulating film in FIG. 5Q.

Subsequently, the fifth insulting film 107 formed of silicon nitride (SiN) is formed so as to cover the fourth insulating film 106 and the conductive film 17 through use of, for example, the plasma CVD method (see FIG. 5Q). After that, the sixth insulating film 108 formed of an acrylic resin or a siloxane resin is formed on the fifth insulting film 107 through use of, for example, the slit coating method (see FIG. 5R). As a result, the pixel part of the imaging panel 1 according to the present embodiment is formed.

The imaging panel 1 and the manufacturing method thereof according to the present embodiment are described above. As described above, the p-type amorphous semiconductor layer 153 in the photoelectric conversion layer 15 of the imaging panel 1 according to the present embodiment has a structure in which the two layers, namely, the first p-type amorphous semiconductor layer 1531 and the second p-type amorphous semiconductor layer 1532 having different extinction coefficients and different dopant concentrations, are layered. Specifically, the extinction coefficient and the dopant concentration of the first p-type amorphous semiconductor layer 1531 are less than those of the second p-type amorphous semiconductor layer 1532. That is, the extinction coefficient and the dopant concentration of the second p-type amorphous semiconductor layer 1532 in contact with the upper electrode 14b, are greater than those of the first p-type amorphous semiconductor layer 1531 located closer to the intrinsic amorphous semiconductor layer 152. Thus, a leakage current is less likely to flow between the upper electrode 14b and the second p-type amorphous semiconductor layer 1532. Further, the extinction coefficient of the first p-type amorphous semiconductor layer 1531 is less than that of the second p-type amorphous semiconductor layer 1532. Thus, the light easily passes from the second p-type amorphous semiconductor layer 1532 to the first p-type amorphous semiconductor layer 1531, and quantum efficiency can be improved.

Operation of X-ray Imaging Device 100

Here, a description is made on an operation of the X-ray imaging device 100 illustrated in FIG. 1. First, X-rays are emitted from the X-ray source 3. At this time, the controller 2 applies a predetermined voltage (bias voltage) to the bias wiring lines 16 (see FIG. 3 and the like). The X-rays emitted from the X-ray source 3 pass through the object S and enter the scintillator 1A. The X-rays having entered the scintillator 1A are converted to fluorescence (scintillation light), and the scintillation light enters the imaging panel 1. When entering the photodiode 12 provided to each of the pixels on the imaging panel 1, the scintillation light is converted, at the photodiode 12, to an electrical charge in accordance with a light amount of the scintillation light. A signal in accordance with the electrical charge converted at the photodiode 12 is read at the signal reading section 2B (see FIG. 2 and the like) via the source wiring line 10 in a case that the TFT 13 (FIG. 3 and the like) is in the on state in response to the gate voltage (positive voltage) output from the gate control section 2A via the gate wiring line 11. Further, an X-ray image in accordance with the read signals is generated at the controller 2.

Above, the description is given on the imagining panel and the manufacturing method thereof according to the embodiment, but the embodiment described above is merely an example. Thus, the imagining panel and the manufacturing method thereof are not limited to the embodiment described above, and the embodiment described above can be carried out by being modified as appropriate without departing from the scope. Now, a description is made on modified examples of the imaging panel.

(1) A case where the p-type amorphous semiconductor layer 153 in the embodiment described above has a structure in which the first p-type amorphous semiconductor layer 1531 and the second p-type amorphous semiconductor layer 1532 having different extinction coefficients and different dopant concentrations are layered is described, but the structure of the p-type amorphous semiconductor layer 153 is not limited thereto. For example, the p-type amorphous semiconductor layer 153 may include three p-type amorphous semiconductor layers having different extinction coefficients and different dopant concentrations or four or more p-type amorphous semiconductor layers having different extinction coefficients and different dopant concentrations such that the extinction coefficients and the dopant concentrations are greater as closer to the upper electrode 14b. That is, it is only required that the p-type amorphous semiconductor layer 153 have the greater extinction coefficients and the greater dopant concentrations as closer to the upper electrode 14b.

Specifically, for example, in the case where the p-type amorphous semiconductor layer 153 has a structure in which three p-type amorphous semiconductor layers are layered, it is preferred that the extinction coefficient of the lowermost p-type amorphous semiconductor layer in contact with the intrinsic amorphous semiconductor layer 152, the extinction coefficient of the intermediate p-type amorphous semiconductor layer, and the extinction coefficient of the uppermost p-type amorphous semiconductor layer in contact with the upper electrode 14b be approximately 0.075, approximately 0.100, and approximately 0.150, respectively. In this case, a flow amount of each gas in the reaction gas used at the time of forming the three p-type amorphous semiconductor layers may be adjusted as described below. At the time of forming the lowermost p-type amorphous semiconductor layer, the $SiH_4$ gas, the $B_2H_6$ gas (with a $B_2H_6$ concentration of 1% obtained by dilution with the $H_2$ gas), and the $H_2$ gas are adjusted to approximately 240 sccm, approximately 100 sccm, approximately 860 sccm, respectively.

Further, at the time of forming the intermediate p-type amorphous semiconductor layer, the $SiH_4$ gas, the $B_2H_6$ gas (with a $B_2H_6$ concentration of 1% obtained by dilution with the H$_2$ gas), and the H$_2$ gas are adjusted to approximately 240 sccm, approximately 300 sccm, approximately 660 sccm, respectively. Further, at the time of forming the uppermost p-type amorphous semiconductor layer, the SiH$_4$ gas, the B$_2$H$_6$ gas (with a B$_2$H$_6$ concentration of 1% obtained by dilution with the H$_2$ gas), and the H$_2$ gas are adjusted to approximately 240 sccm, approximately 500 sccm, approximately 460 sccm, respectively.

(2) In the embodiment described above, the case where a PIN photodiode in which the intrinsic amorphous semiconductor layer 152 is provided between the p-type amorphous semiconductor layer 153 and the n-type amorphous semiconductor layer 151 is used as the photoelectric conversion layer 15 is described, but the structure of the photoelectric conversion layer 15 is not limited thereto. For example, the photoelectric conversion layer 15 may be a planer-type p-n junction semiconductor in which an n-type semiconductor formed by diffusing a dopant such as phosphorous in a part of a p-type silicon substrate is embedded in the p-type silicon substrate and a p-type semiconductor formed by diffusing a dopant such as boron in a part of an n-type silicon substrate is embedded in the n-type silicon substrate. In the case of the photoelectric conversion layer in which the n-type semiconductor is embedded in the p-type silicon substrate, the photoelectric conversion layer is formed such that the n-type semiconductor is in contact with the upper electrode 14b and has a greater extinction coefficient and a greater dopant concentration as closer to the upper electrode 14b. Further, in the case of the photoelectric conversion layer in which the p-type semiconductor is embedded in the n-type silicon substrate, the photoelectric conversion layer is formed such that the p-type semiconductor is in contact with the upper electrode 14b and has a greater extinction coefficient and a greater dopant concentration as closer to the upper electrode 14b.

The imaging panel and the manufacturing method thereof described above may be described as in the following.

An imaging panel according to a first configuration includes a substrate and a photoelectric conversion element disposed on the substrate. The photoelectric conversion element includes a cathode electrode, a first semiconductor layer having a first conductive type, the first semiconductor layer being in contact with the cathode electrode, a second semiconductor layer having a second conductive type different from the first conductive type, the second semiconductor layer being joined to the first semiconductor layer, and an anode electrode in contact with the second semiconductor layer. The second semiconductor layer has a greater extinction coefficient as closer to the anode electrode (the first configuration).

According to the first configuration, the photoelectric conversion element provided on the substrate includes the anode electrode, the second semiconductor layer connected to the anode electrode, the first semiconductor layer joined to the second semiconductor layer, and the cathode electrode connected to the first semiconductor layer. The second semiconductor layer has a greater extinction coefficient as closer to the anode electrode, and hence a leakage current of the photoelectric conversion element is less likely to flow between the second semiconductor layer and the anode electrode. Further, the second semiconductor layer has a less extinction coefficient as closer to the cathode electrode. Thus, the light easily passes through the second semiconductor layer, and quantum efficiency can be improved.

In the first configuration, the second semiconductor layer may include a plurality of layers having the extinction coefficients different from each other, and, among the plurality of layers, a layer closer to the anode electrode may have a greater extinction coefficient (the second configuration).

According to the second configuration, the second semiconductor layer includes the plurality of layers having different extinction coefficients, and the layer closer to the anode electrode has a greater extinction coefficient. Thus, a leak current is less likely to flow between the second semiconductor layer and the anode electrode. Further, the light easily passes through the second semiconductor layer, and quantum efficiency can be improved.

In the first or second configuration, the photoelectric conversion element may further include an intrinsic semiconductor layer between the first semiconductor layer and the second semiconductor layer (the third configuration).

According to the third configuration, the intrinsic semiconductor layer is provided between the first semiconductor layer and the second semiconductor layer. Thus, as compared to the case where the intrinsic semiconductor layer is not provided, a depletion layer is large in a reverse bias state, and carrier mobility can be improved.

In the second or third configuration, among the plurality of layers, a difference between an extinction coefficient of a first layer located closest to the anode electrode and an extinction coefficient of a second layer located farthest from the anode electrode may be 0.005 or greater (the fourth configuration).

In any one of the first to fourth configurations, the second semiconductor layer may have a greater concentration of a dopant, which is added to the second semiconductor layer, as closer to the anode electrode (the fifth configuration).

According to the fifth configuration, the second semiconductor layer may have a greater concentration of a dopant, which is added to the second semiconductor layer, as closer to the anode electrode. Thus, as compared to the case where the concentration of the dopant is uniform in the second semiconductor layer, the depletion layer is broadened, and a leak current is less likely to flow at a boundary surface between the anode electrode and the second semiconductor layer.

A manufacturing method of an imaging panel includes forming a cathode electrode on a substrate, forming a first semiconductor layer having a first conductive type, the first semiconductor layer being in contact with the cathode electrode, forming a second semiconductor layer having a second conductive type different from the first conductive type, the second semiconductor layer being joined to the first semiconductor layer, and forming an anode electrode in contact with the second semiconductor layer. The second semiconductor layer has a greater extinction coefficient as closer to the anode electrode (the first manufacturing method).

According to the first manufacturing method, the cathode electrode, the first semiconductor layer having the first conductive type, the first semiconductor layer being in contact with the cathode electrode, the second semiconductor layer having the second conductive type different from the first conductive type, the second semiconductor layer being joined to the first semiconductor layer, and the anode electrode in contact with the second semiconductor layer are formed on the substrate. The second semiconductor layer has a greater extinction coefficient as closer to the anode electrode. Thus, a leakage current is less likely to flow between the second semiconductor layer and the anode electrode. Further, the second semiconductor layer has a less extinction coefficient as closer to the cathode electrode.

Thus, the light easily passes through the second semiconductor layer, and quantum efficiency is improved.

In the forming a second semiconductor layer according to the first manufacturing method, the second semiconductor layer has a concentration of a dopant added to the second semiconductor layer such that the concentration is greater as closer to the anode electrode (the second manufacturing method).

According to the second manufacturing method, the second semiconductor layer may have a greater concentration of a dopant, which is added to the second semiconductor layer, as closer to the anode electrode. Thus, as compared to the case where the concentration of the dopant is uniform in the second semiconductor layer, the depletion layer is broadened, and a leak current is less likely to flow at a boundary surface between the second semiconductor layer and the anode electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An imaging panel comprising:
    a substrate; and
    a photoelectric conversion element disposed on the substrate,
    wherein the photoelectric conversion element includes
    a cathode electrode,
    a first semiconductor layer having a first conductive type, the first semiconductor layer being in contact with the cathode electrode,
    a second semiconductor layer having a second conductive type different from the first conductive type, the second semiconductor layer being joined to the first semiconductor layer, and
    an anode electrode in contact with the second semiconductor layer, and
    the second semiconductor layer has a greater extinction coefficient as closer to the anode electrode.

2. The imaging panel according to claim 1,
    wherein the second semiconductor layer includes a plurality of layers having the extinction coefficients different from each other, and
    among the plurality of layers, a layer closer to the anode electrode has a greater extinction coefficient.

3. The imaging panel according to claim 2,
    wherein, among the plurality of layers, a difference between an extinction coefficient of a first layer located closest to the anode electrode and an extinction coefficient of a second layer located farthest from the anode electrode is 0.005 or greater.

4. The imaging panel according to claim 1,
    wherein the photoelectric conversion element further includes an intrinsic semiconductor layer between the first semiconductor layer and the second semiconductor layer.

5. The imaging panel according to claim 1,
    wherein the second semiconductor layer has a greater concentration of a dopant added to the second semiconductor layer as closer to the anode electrode.

6. A manufacturing method of an imaging panel comprising:
    forming a cathode electrode on a substrate;
    forming a first semiconductor layer having a first conductive type, the first semiconductor layer being in contact with the cathode electrode;
    forming a second semiconductor layer having a second conductive type different from the first conductive type, the second semiconductor layer being joined to the first semiconductor layer; and
    forming an anode electrode in contact with the second semiconductor layer,
    wherein the second semiconductor layer has a greater extinction coefficient as closer to the anode electrode.

7. The manufacturing method according to claim 6,
    wherein, in the forming a second semiconductor layer, the second semiconductor layer has a concentration of a dopant added to the second semiconductor layer such that the concentration is greater as closer to the anode electrode.

* * * * *